United States Patent [19]

Shinada et al.

[11] 4,377,902

[45] Mar. 29, 1983

[54] METHOD OF MANUFACTURING SEMICONDUCTOR DEVICE USING LASER BEAM CRYSTALLIZED POLY/AMORPHOUS LAYER

[75] Inventors: Kazuyoshi Shinada; Satoshi Shinozaki, both of Yokohama, Japan

[73] Assignee: VLSI Technology Research Association, Tokyo, Japan

[21] Appl. No.: 183,815

[22] Filed: Sep. 3, 1980

[30] Foreign Application Priority Data

Sep. 7, 1979 [JP] Japan ................. 54-114950

[51] Int. Cl.³ .......................................... H01L 21/263
[52] U.S. Cl. ......................... 29/576 B; 29/571; 148/1.5; 148/187; 219/121 LF; 357/91; 427/53.1
[58] Field of Search ................. 148/1.5, 187; 219/121 LF; 357/91; 427/53.1; 29/576 B, 571

[56] References Cited

U.S. PATENT DOCUMENTS

| | | | |
|---|---|---|---|
| 4,063,967 | 12/1977 | Graul et al. | 148/1.5 |
| 4,198,246 | 4/1980 | Wu | 148/1.5 |
| 4,214,918 | 7/1980 | Gat et al. | 148/1.5 |
| 4,240,843 | 12/1980 | Celler et al. | 148/1.5 |
| 4,267,011 | 5/1981 | Shibata et al. | 357/91 |
| 4,269,631 | 5/1981 | Anantha et al. | 357/91 |
| 4,272,880 | 6/1981 | Pashley | 29/571 |

OTHER PUBLICATIONS

Lau et al., Epitaxial Growth of Deposited Amorphous Layer by Laser Annealing, 33(2) Appl. Phys. Lett. 130 (Jul. 15, 1978).
Koyanagi et al., Appl. Phys. Letts. 35 (Oct. 1979) 621.
Klimenko et al., Sov. J. Quant. Electron. 5 (1976) 1289.
Celler et al., Appl. Phys. Letts. 32 (1978) 464.
Tseng et al., Appl. Phys. Letts. 32 (1978) 824.
Anantha et al., IBM-TDB, 22 (Jul. 1979) 575.

*Primary Examiner*—Upendra Roy
*Attorney, Agent, or Firm*—Finnegan, Henderson, Farabow, Garrett & Dunner

[57] ABSTRACT

A method of manufacturing a semiconductor device comprising a step of forming a desired opening in an insulating film formed on a single-crystalline semiconductor substrate, a step of forming an impurity-doped amorphous or polycrystalline semiconductor layer to cover the surface of said insulating film and the exposed surface of said semiconductor substrate in said opening, and a step of irradiating said semiconductor layer with a laser beam to let a portion of said semiconductor layer on said insulating film be polycrystallized or remain polycrystalline and let a portion of said semiconductor layer on said semiconductor substrate be single-crystallized to form a junction between said single-crystallized semiconductor layer portion and said semiconductor substrate.

11 Claims, 9 Drawing Figures

METHOD OF MANUFACTURING SEMICONDUCTOR DEVICE USING LASER BEAM CRYSTALLIZED POLY/AMORPHOUS LAYER

BACKGROUND OF THE INVENTION

This invention relates to a method of manufacturing semiconductor devices, in which the junction formation is improved.

Recently, various technical developments have been made in connection with the process of manufacturing semiconductor devices such as the oxide isolation, shallow junction formation and multilayer interconnection for the purposes of increasing the speed of operation and density of integration of the semiconductor devices. Particularly, the shallow junction formation permits extreme improvements of properties of the semiconductor device since it reduces the junction area, junction capacitance and series resistance in the device.

However, where a shallow junction is formed, the lateral diffusion length is short, so that in case when forming, for instance, an emitter region in a base region of a bipolar transistor, in the step of forming a contact hole by etching the diffusion hole it is likely that not only the emitter region but also the base region is exposed due to the etching of the side wall of the hole and hence to the increase of the hole diameter. In this case, the problem of the short-circuit of the emitter-base junction by an electrode formed on the wafer arises.

In order to solve such a problem, a method of producing a bipolar transistor as shown in FIG. 1 has been proposed. In this method, a silicon oxide layer 3 is formed on an n-type epitaxial layer 2, in which a p-type base region 1 is formed, and a diffusion hole 4 is formed in this silicon oxide layer 3. Then, a poly-silicon layer 5 doped with a great quantity of an impurity of the opposite conductivity type to the base region 1 (for instance arsenic) is formed on the entire surface, and then an $n^+$-type emitter region 6 is formed through thermal diffusion in the base region 1. Subsequently, the poly-silicon layer 5 is selectively removed to leave a region greater than the hole 4, and then an emitter electrode 7 is formed. By this method a poly-silicon layer portion greater than the diffusion hole 4 remains, so that emitter-base junction is not exposed and the short-circuit between the base region 1 and emitter region 6 does not occur. However, this method requires photolithography for selectively leaving a poly-silicon layer portion. In addition, a shift of the collector-base junction as shown by a broken line in FIG. 1 is caused by a high temperature thermal treatment in a diffusion furnace, so that it is difficult to control the base width.

There has also been proposed a method of manufacture of a bipolar transistor as shown in FIG. 2. In this method, after the formation of a silicon oxide layer 3 on an n-type epitaxial layer 2 having a p-type base region 1 formed therein, an opening 8 is formed in this silicon oxide layer 3, and an emitter region 9 is formed by selectively growing a single-crystalline silicon layer containing a great quantity of an emitter impurity in the opening 8, followed by the formation of an emitter electrode. This method requires no photolithography, and also by this method the emitter-base junction will not be contiguous to the emitter electrode. However, the highly advanced techniques of the selective vapor growth method are required, and also an increased number of steps are involved in the manufacturing process, thus leading to a high cost. Further, a shift of the collector-base junction as shown by a broken line in FIG. 2 is caused again by a high temperature thermal treatment in the vapor growth step like the method of FIG. 1, thus making the base width control difficult.

SUMMARY OF THE INVENTION

The primary object of the invention is to provide a method of manufacturing a semiconductor device, which permits the formation of a shallow junction within an opening formed in an insulating film formed on the substrate, and with which the aforementioned short-circuit and the shift of a junction previously formed in the substrate in such a manner as to surround the shallow junction can be prevented.

According to the invention, there is provided a method of manufacturing a semiconductor device comprising a step of forming a desired opening in an insulating film formed on a single-crystalline semiconductor substrate, a step of forming an impurity-doped amorphous or polycrystalline semiconductor layer to cover the surface of said insulating film and the exposed surface of said semiconductor substrate within said opening, and a step of irradiating said semiconductor layer with a laser beam to let a portion of said semiconductor layer on said insulating film be polycrystallized or remain to be polycrystalline and let a portion of said semiconductor layer on said semiconductor substrate be single-crystallized to form a junction between said single-crystallized semiconductor layer portion and said semiconductor substrate.

DETAILED DESCRIPTION OF THE PREFERRED EMBODIMENT

Figure 1:
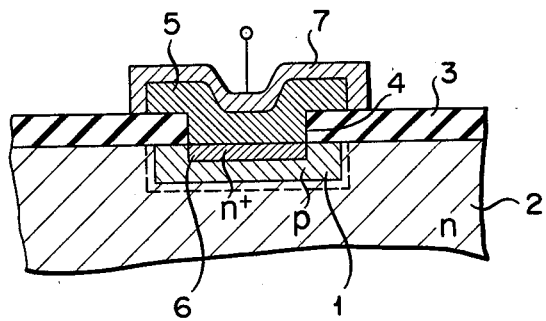
FIG. 1 is a sectional view showing part of a bipolar transistor produced by a prior-art method.
Figure 2:
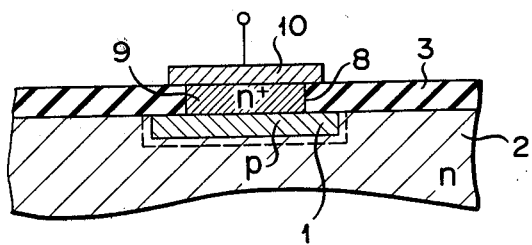
FIG. 2 is a sectional view showing part of a bipolar transistor produced by another prior-art method.

The invention seeks to provide a method of manufacturing a semiconductor device, by which a junction is formed by making use of a phenomenon that with the irradiation of an amorphous or polycrystalline silicon layer with a laser beam a portion of the amorphous or polycrystalline silicon layer on single-crystalline silicon is converted into single-crystalline silicon while a portion of the amorphous or polycrystalline silicon layer on an insulating film is converted into or remains as polycrystalline silicon. The term "amorphous" or "polycrystalline" is hereinafter generally referred to as non-single-crystalline. When a junction is formed in the manufacture of a semiconductor device by irradiating an impurity-doped non-single-crystalline silicon layer formed on a single-crystalline silicon substrate, the non-single-crystalline silicon absorbs the laser beam energy in large quantities compared to the single-crystalline silicon so that it is single-crystallized in a very short period of time. On the other hand, the single-crystalline silicon substrate hardly absorbs the laser beam energy so that it is hardly subject to the thermal influence of the laser beam irradiation. Thus, unlike the prior-art method no shift of the junction previously formed in the single-crystalline silicon substrate is thermally caused.

In one mode of the invention, a desired opening is formed in an insulating film formed on a single-crystalline semiconductor substrate having a junction formed therein, and a non-single-crystalline semiconductor layer doped with an impurity of the same conductivity type as that of the substrate is formed on the entire surface of the wafer. The non-single-crystalline semiconductor layer thus formed is subsequently irradiated with a laser beam, whereby a portion of the non-single crystalline semiconductor layer on the insulating film is polycrystallized or remains to be polycrystalline, while a portion of the non-single-crystalline semiconductor layer that is found in the opening and in contact with the single-crystalline semiconductor substrate is single-crystallized. In this way, a new junction is formed on the inner side of the junction previously formed in the semiconductor substrate. At this time, the semiconductor substrate is not subject to any thermal influence, so that the junction previously formed in the substrate is not shifted. Afterwards, the polycrystalline semiconductor layer on the insulating film is etched away or converted to an oxide layer by making use of the fact that the etching rate and oxidation rate of the polycrystalline semiconductor layer is higher than those of the single-crystalline semiconductor.

With this method of producing a semiconductor device, it is possible to form a shallow junction within an opening formed in an insulating film. Also, since the junction previously formed in such a manner as to surround the shallow junction is not exposed, there is no possibility of the short-circuit between the two regions defining the previously formed junction. Further, the shift of the previously formed junction is prevented, so that it is possible to readily control the length of the junction length.

As has been shown, according to the invention it is possible to provide a method of producing a semiconductor device, in which the junction area, junction capacity and series resistance are reduced so that it is capable of high speed operation and has high reliability, with high yield.

The single-crystalline semiconductor substrate used in the method according to the invention may be single-crystalline silicon or single-crystalline germanium. Also, as the single-crystalline semiconductor substrate may be used one, which has a junction previously formed in it, or one, which has no such a junction.

The none-single-crystalline semiconductor layer doped with an impurity of the conductivity type opposite to or same as that of the semiconductor substrate in the method according to the invention may be formed by a deposition method, in which the layer is deposited by supplying the impurity source and raw material of the non-single-crystalline semiconductor to a depositing apparatus, or by a method, in which a non-single-crystalline semiconductor layer free from the impurity is first formed by deposition and then doped with the impurity by ion-implantation. The latter method has a merit that the amount of the impurity doped can be accurately controlled. The impurity may be of n-type such as arsenic and phosphorus or of p-type such as boron. Examples of the material of the non-single-crystalline semiconductor layer are silicon and germanium, and the same material as the single-crystalline semiconductor layer is preferably used.

As the laser beam used in the method according to the invention it is desirable to select one, the energy of which is absorbed by the non-single-crystalline semiconductor layer only and not by the single-crystalline semiconductor. The wavelength of such a laser beam preferably ranges from 0.8 to 2.0 microns. For example, an Nd-YAG laser beam with a wavelength of 1.06 microns may be used. Also, the laser beam is preferably a pulse laser beam. The pulse width is preferably at least 1 $\mu$sec, and power preferably ranges from 0.7 to 5 $J/cm^2$.

In the method according to the invention, the single-crystalline semiconductor layer obtained from the non-single-crystalline semiconductor layer by the laser beam irradiation may be separated from the polycrystalline semiconductor layer by one of the following two methods. In the first method, the polycrystalline semiconductor layer alone is removed by means of wet etching and this can be done so by virtue of the fact that the etching rate of the polycrystalline semiconductor is higher than that of the single-crystalline semiconductor. In the second method, the polycrystalline semiconductor layer alone is converted into an oxide layer, which is an insulator, by low temperature oxidation, and this can be done so by virtue of the fact that the oxidation rate of the polycrystalline semiconductor is higher than that of the single-crystalline semiconductor.

Now, examples of the invention will be described with reference to drawings.

EXAMPLE 1

In this example the invention was applied to the manufacture of a bipolar transistor.

Figure 3A:
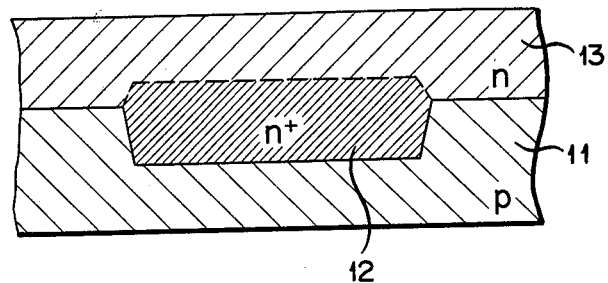
FIGS. 3A to 3F are sectional views showing respective steps of a method of manufacture of a bipolar transistor embodying the invention.
Figure 3B:
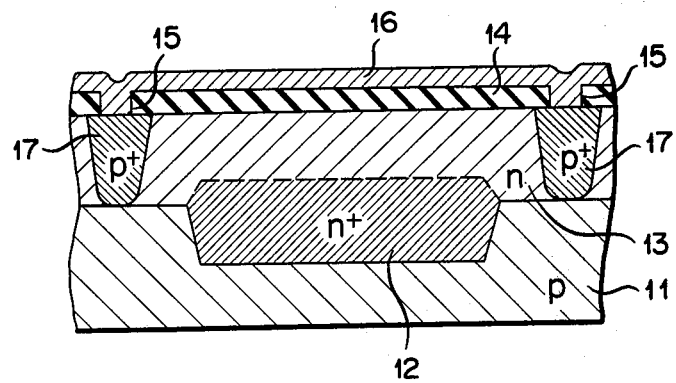

In the first step as shown in FIG. 3A, an $n^+$-type burried layer 12 having a surface impurity concentration of $10^{20}$ $cm^{-3}$ or above was formed by diffusing arsenic in a $p^-$-type silicon substrate 11 with a resistivity of 18 to 25 $\Omega$cm over a desired surface region of the substrate. Then, an n-type single-crystalline epitaxial layer 13 with a resistivity of 0.2 $\Omega$cm and a thickness of 1.5 microns was grown. Subsequently, as shown in FIG. 3B, a silicon oxide film 14 with a thickness of 5,000 Å was formed to cover the n-type epitaxial layer 13. Then, a diffusion window 15 was formed in the oxide film 14 by selectively etching away a portion thereof corresponding to an isolation region, followed by deposition of a boron-doped glass film 16 (BSG film) over the entire surface and subsequent thermal treatment to cause diffusion of boron in the BSG film 16 through the diffusion window 15 into the n-type epitaxial layer 13. In this way, a $p^+$-type isolation region 17 as deep as reaching the $p^+$-type silicon substrate 11 was formed.

Figure 3C:
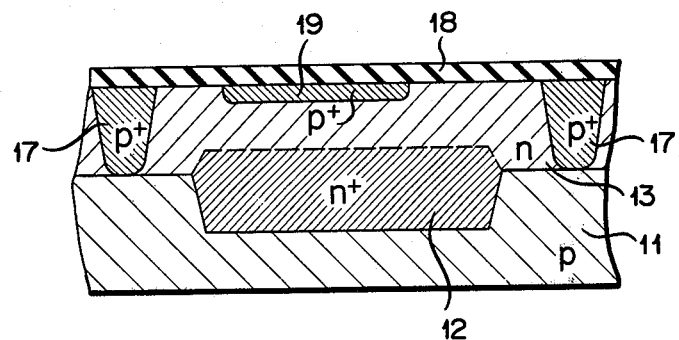

Subsequently, the BSG film 16 and silicon oxide film 14 are entirely etched away by using an etchant containing HF, and a thermal treatment was made in a wet oxygen atmosphere at 1,000° C. to form a new silicon oxide layer 18 with a thickness of 3,000 Å as shown in FIG. 3C. Then, boron is selectively ion-implanted under the conditions of an energy value of 80 keV and an ion dose of $23 \times 10^{14}$ $cm^{-2}$, followed by thermal treatment in a nitrogen atmosphere at 1,000° C. for 20 minutes to form a p-type base region 19 with a sheet resistivity of $\rho s = 35$ $\Omega/\square$ and a depth of 0.3 micron.

Figure 3D:
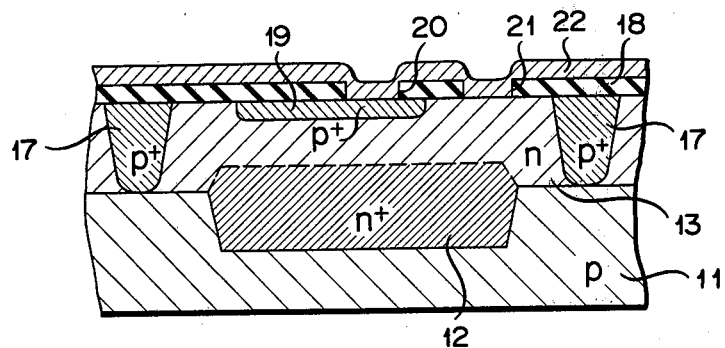
Figure 3E:
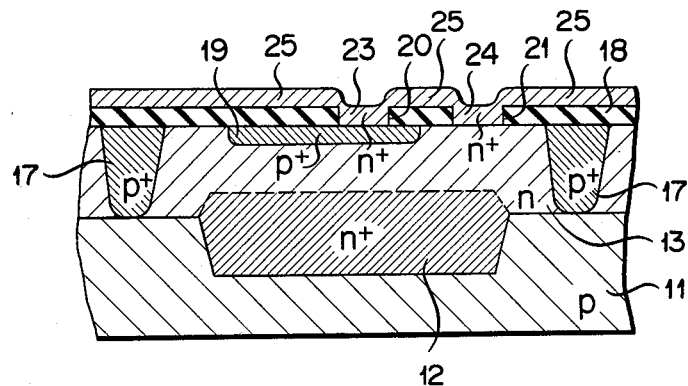

Then, as shown in FIG. 3D, portions of the silicon oxide film 18 corresponding to an emitter region and a collector region respectively are selectively etched away to form openings 20 and 21, and then an amorphous silicon layer 22 containing arsenic at a concentration of $10^{20}$ cm$^{-3}$ and having a thickness of 0.3 micron was formed by vacuum deposition. Subsequently, the entire surface of the amorphous silicon layer 22 was irradiated with an Nd-TAG laser beam with a wavelength of 1.06 microns, a pulse width of 20 nsec. and a power value of 2 J/cm$^2$. At this time, the amorphous silicon layer 22 is fused, and its portions in contct with the single-crystalline n-type epitaxial layer 13 within the openings 20 and 21 were converted into a single-crystalline layer with a sheet resistivity of $\rho_s=25$ Ω/□ and a deepness of 0.3 micron, whereby an emitter region 23 and a collector region 24 as shown in FIG. 3E were formed. Meanwhile, the portion of the amorphous silicon layer 22 on the oxide film 18 was converted into an arsenic-doped polycrystalline layer 25.

Figure 3F:
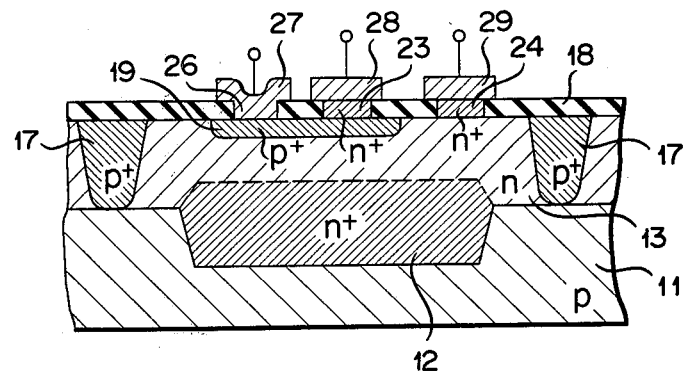

Thereafter, the entire surface was subjected to wet-etching, whereby only the polycrystalline silicon layer 25 was removed due to the difference in the etching rate between the polycrystalline silicon and single-crystalline silicon. Then, as shown in FIG. 3F, the silicon oxide layer 18 is selectively removed to form a base contact hole 26, followed by deposition of aluminum film over the entire surface and subsequent patterning of the aluminum film to form a base electrode 27, an emitter electrode 28 and a collector electrode 29. In this way, a bipolar transistor was obtained.

The bipolar transistor obtained in this way, permitted extreme reduction of the short-circuit of the emitter-base junction by the emitter electrode 28 to be obtained because of the fact that the emitter region 23 is self-aligned, while the emitter and collector regions 23 and 24 are shallow. Also, the base-collector junction which was formed before the laser beam irradiation was not shifted in position by the irradiation because the irradiation had no influence upon the impurity profile of the semiconductor region other than the emitter region 23. Thus, it was possible to readily control the length of the base region 19 to a predetermined length.

EXAMPLE 2

In this example, the invention was applied to a MOS field effect transistor.

Figure 4:
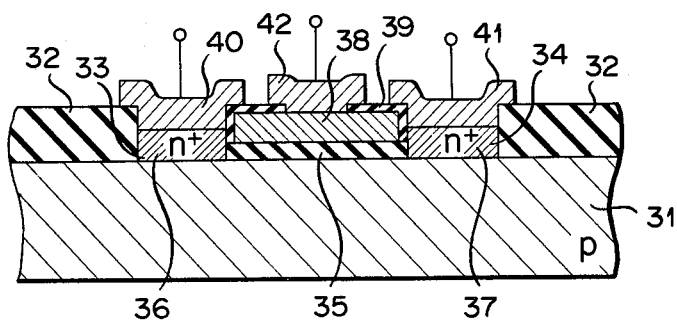
FIG. 4 is a sectional view of MOS field effect transistor produced by another embodiment of the method according to the invention.

Referring to FIG. 4, a field oxide film 32 was grown on a p-type silicon substrate 31, and then a silicon oxide film was formed over the device region. The silicon oxide film was then selectively etched to form openings 33 and 34 while also forming a gate oxide film 35. Then, similar to the Example 1 an amorphous silicon layer was formed over the entire surface, followed by irradiation of the entire surface of this layer with an Nd-YAG laser beam to form n+-type source and drain regions 36 and 37 consisting of arsenic-doped single-crystalline silicon while also converting the arsenic-doped amorphous silicon layer on the field oxide film 32 and gate oxide film 35 into an arsenic-doped polycrystalline silicon layer. Subsequently, the polycrystalline silicon layer on the field oxide film 32 was wet-etched away by masking the arsenic-doped polycrystalline silicon layer on the gate oxide film 35 with a photoresist, thus obtaining a gate electrode 38 consisting of the arsenic-doped polycrystalline silicon on the gate oxide film 35. Thereafter, a thin oxide film 39 was formed on the surface of the gate electrode 38 through a low temperature oxidation treatment for a short period of time, and then it is selectively removed. Then, aluminum electrodes 40, 41 and 42 were formed by the usual method, thus obtaining a MOS field effect transistor as shown in FIG. 4.

With the MOS field effect transistor obtained in this way, the yield was extremely improved since the aluminum electrodes 40 and 41 are contiguous to neither source-substrate junction nor drain-substrate junction. Also, it was possible to control the channel length to the gate width because of the fact that there results no diffusion of the impurity in the source and drain regions 36 and 37 in the lateral directions into the gate region. Further, it was possible to readily control the threshold voltage ($V_{th}$) since in the step of forming the source and drain regions 36 and 37 by the laser beam irradiation the impurity profile of the channel was not subject to the thermal influence at all. Furthermore, it was possible to increase the integration density of the IC because of the fact that the redistribution of the impurity in the isolation region was prevented.

While in the above Examples amorphous silicon was used as the non-single-crystalline semiconductor, similar results could also be obtained by using polycrystalline silicon.

What we claim is:

1. A method of manufacturing a semiconductor device comprising:
    making a desired aperture in an insulating film on a single-crystal semiconductor substrate having an impurity-doped semiconductor region, thereby exposing a portion of said semiconductor region, the semiconductor substrate and the semiconductor region forming a base-collector junction;
    covering the surface of said insulating film and the exposed semiconductor region with an impurity-doped amorphous semiconductor layer; and
    irradiating said semiconductor layer with a laser beam, thereby converting the portion of said semiconductor layer covering said insulating film into a polycrystalline semiconductor layer and converting the portion of said semiconductor layer covering the exposed semiconductor region into a single crystal semiconductor layer, forming thereby an emitter-base junction between said single-crystal semiconductor layer portion and said semiconductor region.

2. A method of manufacturing a semiconductor device comprising:
    making a desired aperture in an insulating film on a single-crystal semiconductor substrate having an impurity-doped semiconductor region, thereby exposing part of said semiconductor region, the semiconductor substrate and the semiconductor region forming a base-collector junction;
    covering the surface of said insulating film and the exposed semiconductor region with an impurity-doped polycrystalline semiconductor layer; and
    irradiating said semiconductor layer with a laser beam, thereby retaining the portion of said semiconductor layer covering said insulating film in the polycrystalline state and converting the portion of said semiconductor layer covering the exposed semiconductor region into a single crystal semiconductor layer, forming thereby an emitter-base junction between said single-crystal semiconductor layer portion and said semiconductor region.

3. A method of manufacturing a semiconductor region comprising:
    forming a field insulating film on a single crystal semiconductor substrate;
    forming a thin insulating film on a device region of the semiconductor substrate;

making apertures in said thin and film insulating films, thereby exposing portions of the semiconductor substrate surface therethrough and also forming a gate insulating film;

forming an impurity-doped amorphous semiconductor layer covering the surfaces of said field insulating film, said gate insulating film and the exposed portions of said semiconductor substrate;

irradiating said impurity-doped amorphous semiconductor layer with a laser beam, thus converting the portions of the semiconductor layer covering said field and gate insulating films into polycrystalline doped regions and converting the portions of said semiconductor layer covering the semiconductor substrate into single-crystal doped regions;

removing the polycrystalline semiconductor layer from the field insulating film, thereby leaving the single-crystal doped regions on the semiconductor surface as source and drain regions and the polycrystalline doped region on the gate insulating film as a gate electrode; and oxidizing the surface of the polycrystalline doped region covering said gate insulating film, thereby insulating it from the single crystal doped regions.

4. A method of manufacturing a semiconductor region comprising:

forming a field insulating film on a single crystal semiconductor substrate;

forming a thin insulating film on a device region of the semiconductor substrate;

making apertures in said thin and film insulating films, thereby exposing portions of the semiconductor substrate surface therethrough and also forming a gate insulating film;

forming an impurity-doped polycrystalline semiconductor layer covering the surfaces of said field insulating film, said gate insulating film and the exposed portions of said semiconductor substrate;

irradiating said impurity-doped polycrystalline semiconductor layer with a laser beam, thus retaining the portions of the semiconductor layer covering said field and gate insulating films as polycrystalline doped regions and converting the portions of said semiconductor layer covering the semiconductor substrate into single-crystal doped regions;

removing the polycrystalline semiconductor layer from the field insulating film, thereby leaving the single-crystal doped regions on the semiconductor surface as source and drain regions and the polycrystalline doped region on the gate insulating film as a gate electrode; and oxidizing the surface of the polycrystalline doped region covering said gate insulating film, thereby insulating it from the single crystal doped regions.

5. A method according to any one of claims 1, 2, 3 and 4 wherein the wavelength of said laser beam ranges from 0.8 to 2.0 microns.

6. A method according to any one of claims 1, 2, 3 and 4, wherein the pulse width of said laser beam is at least 1 $\mu$sec.

7. A method according to any one of claims 1, 2, 3 and 4, wherein said impurity-doped semiconductor layer is formed by forming an undoped semiconductor layer and then doping said undoped semiconductor layer with impurity by ion implantation.

8. A method according to any one of claims 1, 2, 3 and 4, wherein said impurity-doped semiconductor layer is formed by vacuum depositing an impurity source and a semiconductor at the same time.

9. A method according to claim 1 or claim 2, wherein only the polycrystalline semiconductor layer on said insulating film resulting from said laser beam irradiation is removed by etching.

10. A method according to claim 1 or claim 2, wherein the polycrystalline semiconductor layer on said insulating film resulting from said laser beam irradiation is converted to an oxide layer by a low temperature oxidation treatment.

11. A method according to any one of claims 1, 2, 3 and 4, wherein said single-crystal semiconductor and the polycrystalline semiconductor layer are comprised of silicon.

* * * * *